(12) United States Patent
Sato et al.

(10) Patent No.: US 6,442,281 B2
(45) Date of Patent: *Aug. 27, 2002

(54) LOUDNESS VOLUME CONTROL SYSTEM

(75) Inventors: Shinichi Sato; Akira Shimizu, both of Saitama-ken (JP)

(73) Assignee: Pioneer Electronic Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 34 days.

(21) Appl. No.: 08/859,706

(22) Filed: May 21, 1997

(30) Foreign Application Priority Data

May 23, 1996 (JP) .............................. 8-151609

(51) Int. Cl.⁷ ................................. H03G 9/00
(52) U.S. Cl. ................... 381/102; 381/119; 381/104
(58) Field of Search ............... 381/104, 107, 381/119, 98, 99, 109, 102

(56) References Cited

U.S. PATENT DOCUMENTS

| | | | | | |
|---|---|---|---|---|---|
| 4,435,833 A | * | 3/1984 | Thakkar | ...................... | 381/109 |
| 5,054,077 A | * | 10/1991 | Suzuki | ...................... | 381/109 |
| 5,060,272 A | * | 10/1991 | Suzuki | ...................... | 381/109 |
| 5,200,708 A | * | 4/1993 | Morris | ...................... | 381/109 |
| 5,303,371 A | * | 4/1994 | Nakajima | ...................... | 381/109 |
| 5,355,531 A | * | 10/1994 | Iwata | ...................... | 381/109 |
| 5,774,566 A | * | 6/1998 | Huber | ...................... | 381/119 |
| 5,872,854 A | * | 2/1999 | Lee | ...................... | 381/109 |

* cited by examiner

*Primary Examiner*—Minsun Oh Harvey
(74) *Attorney, Agent, or Firm*—Arent Fox Kintner Plotkin & Kahn, PLLC

(57) ABSTRACT

Difference compensation circuits are connected to a volume controller having a tap in series. Each of the difference compensation circuit comprises a voltage control amplifier and an external CR network. The difference compensation circuits are arranged so as to independently attenuate a bass range and increase a mid-range in accordance with an amount of volume control by the volume controller.

9 Claims, 7 Drawing Sheets

FIG.7

| ATT (dB) | Bass (dB) | Mid (dB) | Tre (dB) |
|---|---|---|---|
| $-\infty$ | +4 |  | +2 |
| . | . |  | . |
| . | . |  | . |
| −60 | +4 |  | +2 |
| . |  | −2 |  |
| . |  | . |  |
| . |  | . |  |
| −50 |  | −2 |  |
| . |  |  |  |
| . |  |  |  |
| −40 |  |  |  |
| . | −2 |  |  |
| . | . |  |  |
| . | . |  |  |
| −30 | −2 |  |  |
| . |  |  |  |
| . |  |  |  |
| . |  |  |  |
| 0 |  |  |  |

LOUDNESS VOLUME CONTROL SYSTEM

BACKGROUND OF THE INVENTION

The present invention relates to a loudness volume control system for an audio device.

In an audio system, when the volume is small, low and high frequency ranges are insufficient because of the characteristic of auditory sensation. Therefore, a volume control system in the audio system is provided with a function for changing a frequency characteristic in accordance with a volume position as a loudness volume control system.

FIG. 8 shows a well-known example of the frequency characteristic of the auditory sensation by Robinson et al. In FIG. 8, each line shows a sound pressure level of a pure sound which a man having a normal auditory sensation feels as a sound at the same volume over an audio frequency.

FIG. 9 shows a conventional loudness volume control system having a tap. The control system comprises a variable resistor VR having an end a connected to a signal input terminal IN, a center tap b, and the other end c connected to the ground. A slider d connected to a signal output terminal OUT is slidably engaged with the variable resistor VR. Between the end a and the center tap b of the variable resistor VR, a compensating capacitor C1 for compensating a high frequency range and a resistor R1 which are connected in series are connected in parallel. Between the center tap b and the other end c of the variable resistor VR, a compensating capacitor C2 for compensating a low frequency range and a resistor R2 which are connected in series are connected in parallel.

In operation, when the slider d is slid on the variable resistor VR between the tap b and the end c, the frequency characteristic is controlled to have a constant output level in low and high frequency ranges with respect to the middle frequency range. On the other hand, when the slider d slides on the variable resistor VR between the end a and the tap b, as a resistance between the tap b and the slider d increases, a resistance between the end a and the slider d gradually reduces. Thus, the frequency characteristic becomes flat as a whole.

The volume control system having a mechanical tap can be replaced with an integrated circuit system, so that the same characteristic is electronically obtained to achieve an electronic volume controller.

FIG. 10 shows a frequency characteristic of the aforementioned conventional system, taking the volume position as a parameter. It will be seen that at a low volume position (attenuation of the volume is large), low and high frequency ranges are increased compared with the middle frequency range. At a high volume position, the frequency is approximately flat.

In such a characteristic of the conventional system, the low and high frequency levels in the small volume are insufficient with respect to the characteristic of auditory sensation of FIG. 8. In particular, in a room of a car having a small space with noises, a problem that insufficiency in low and high frequency ranges is increased rises. Furthermore, if the volume level is lowered from the tap position, the frequency characteristic is not gradually changed. Thus, as shown in FIG. 10, in curves of attenuation of volume of −30 dB, −35 dB, and −40 dB, the frequency characteristics are not changed. As a result, insufficiency in the low and high frequency ranges is increased.

SUMMARY OF THE INVENTION

An object of the present invention is to provide a loudness volume control system where even if the volume position is low, insufficiency of the characteristic in low and high frequency ranges is eliminated with a simple structure.

According to the present invention, there is provided a loudness volume control system comprising a volume controller having a tap, at least one difference compensation circuit connected to the volume controller in series, the difference compensation circuit being arranged so as to independently control a bass range and a mid-range in accordance with an amount of volume control by the volume controller.

The difference compensation circuit is arranged so as to attenuate a bass range level or a treble range level, or to increase a mid-range level in a first level range from a maximum volume level to a volume level of the volume controller, thereby providing a frequency characteristic having a small level changing quantity, and so as to attenuate the mid-range level, or to increase the bass range,level or the treble range level in a second level range lower than the volume level.

The difference compensation circuit may be provided to attenuate only the bass range, or only the treble range, or the bass range and treble range, and increase the mid-range.

The difference compensation circuit comprises a voltage control amplifier and an external CR network.

These and other objects and features of the present invention will become more apparent from the following detailed description with reference to the accompanying drawings.

BRIEF DESCRIPTION OF DRAWINGS

FIG. 7 is a diagram showing a lookup table for the operation;

DETAILED DESCRIPTION OF THE PREFERRED EMBODIMENT

Figure 1:
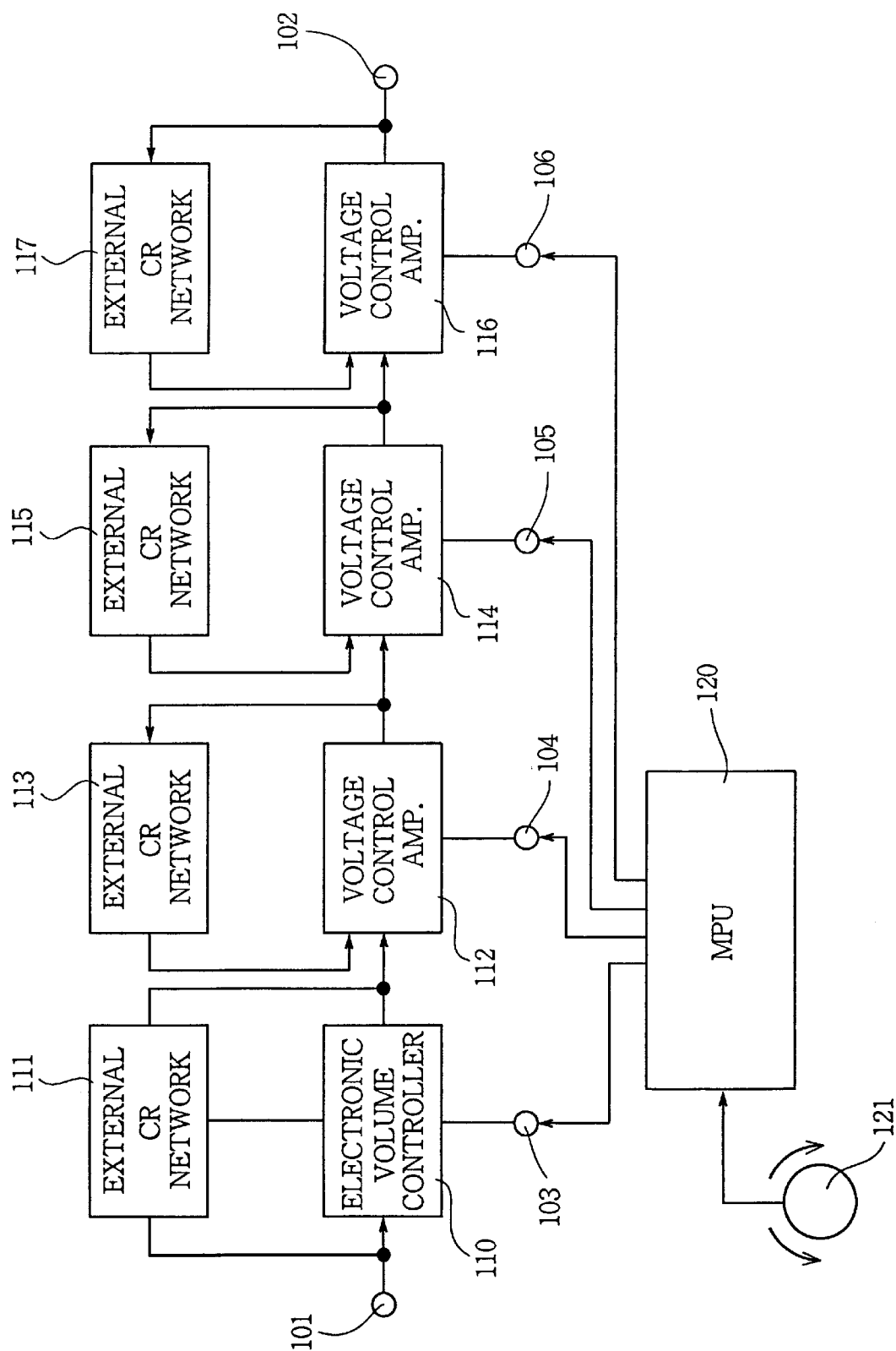
FIG. 1 is a block diagram showing a loudness volume control system of the present invention.

Referring to FIG. 1, a loudness volume control system of the present invention comprises an electronic volume controller 110 having a tap, three voltage control amplifiers 112, 114 and 116, and four external CR networks 111, 113, 115 and 117.

An input terminal 101 applied with an audio signal is connected to the electronic volume controller 110 with tap. The electronic volume controller 110 with tap is connected to the external CR network 111, thereby constituting a loudness volume control circuit. An output of the electronic volume controller 110 is connected to the voltage control amplifier 112.

The voltage control amplifier 112 is connected to the external CR networks 113, thereby constituting a bass range (low frequency range) control circuit. An output of the voltage control amplifier 112 is connected to the external CR network 113 and to the voltage control amplifier 114. The external CR network 113 produces an output signal which is fed to the voltage control amplifier 112. Thus, the external CR network 113 is operated as a feedback circuit of the voltage control amplifier 112.

The voltage control amplifier 114 is connected to the external CR networks 115, thereby constituting a mid-range (middle frequency range) control circuit. An output of the voltage control amplifier 114 is connected to the external CR network 115 and to the voltage control amplifier 116. The external CR network 115 produces an output signal which is fed to the voltage control amplifier 114. Thus, the external CR network 115 is operated as a feedback circuit of the voltage control amplifier 114.

The voltage control amplifier 116 is connected to the external CR networks 117, thereby constituting a treble (high frequency range) control circuit. An output of the voltage control amplifier 116 is connected to the external CR network 117 and to an output terminal 102. The external CR network 117 produces an output signal which is fed to the voltage control amplifier 116. Thus, the external CR network 117 is operated as a feedback circuit of the voltage control amplifier 116. These circuits 112, 114 and 116 are connected in series and operated as difference compensation circuits.

The loudness volume control system further has a micro processor unit (MPU) 120 and an external volume control 121 connected to the MPU 120. The MPU 120 is connected to a voltage control terminal 103 of the electronic volume controller 110 and voltage control terminals 104, 105 and 106 of the voltage control amplifiers 112, 114 and 113, respectively. When the external volume control 121 is rotated to a desired volume position, the volume control 121 produces a volume position signal which is applied to the MPU 120. The MPU 120 produces a control signal which is applied to each of the voltage control terminals 103, 104, 105 and 106.

In the loudness control circuit of the electronic volume controller 110 and the external CR network 111, the characteristic of the external CR network is set to have a predetermined characteristic. Namely, when the voltage control terminal 103 produces a voltage corresponding to a tap position, the loudness control circuit operates to increase a level of low, and high frequency ranges higher than a curve of an auditory sensation characteristic or a desired frequency characteristic.

In the bass control circuit 112, 113, mid-range control circuit 114, 115 and treble control circuit 116, 117, each level of the respective bands is attenuated or increased in accordance with a voltage in each of the voltage control terminals 104, 105 and 106.

In operation, an output voltage applied to each of the voltage control terminals 103, 104, 105 and 106 is controlled in accordance with the volume position signal from the external volume control 121. Thus, a desired loudness volume control characteristic is obtained.

The output voltage is controlled by a lookup table as shown in FIG. 7. In place of the lookup table, the voltage can be controlled by control programs of the MPU 120.

As shown in FIG. 7, if a corresponding attenuation of a selected volume position signal is between the infinity and 50 dB, the mid-range is attenuated by 2 dB. Therefore, a voltage for attenuating the mid-range by 2 dB is applied to the voltage control terminal 105 of the mid-range control circuit. If a corresponding attenuation of the volume position signal is between 40 and 30 dB, a voltage for attenuating the bass by 2 dB is applied to the terminal 104 of the bass control circuit.

Furthermore, if a corresponding attenuation of the volume position signal is between the infinity and 60 dB, the low frequency range is increased. Therefore, the voltage applied to the voltage control terminal 104 is controlled such that the bass is increased by 4 dB, and the voltage applied to the voltage control terminal 106 is controlled such that the treble is increased by 2 dB.

Figure 2:
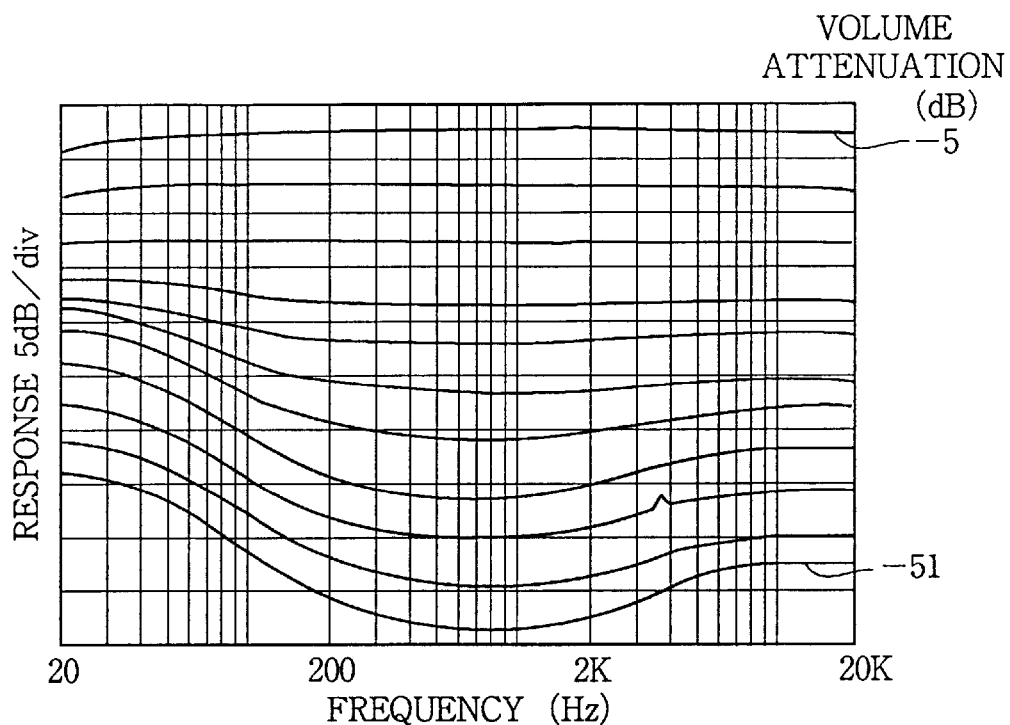
FIG. 2 is a diagram showing a frequency characteristic of the loudness volume control system.
Figure 10:
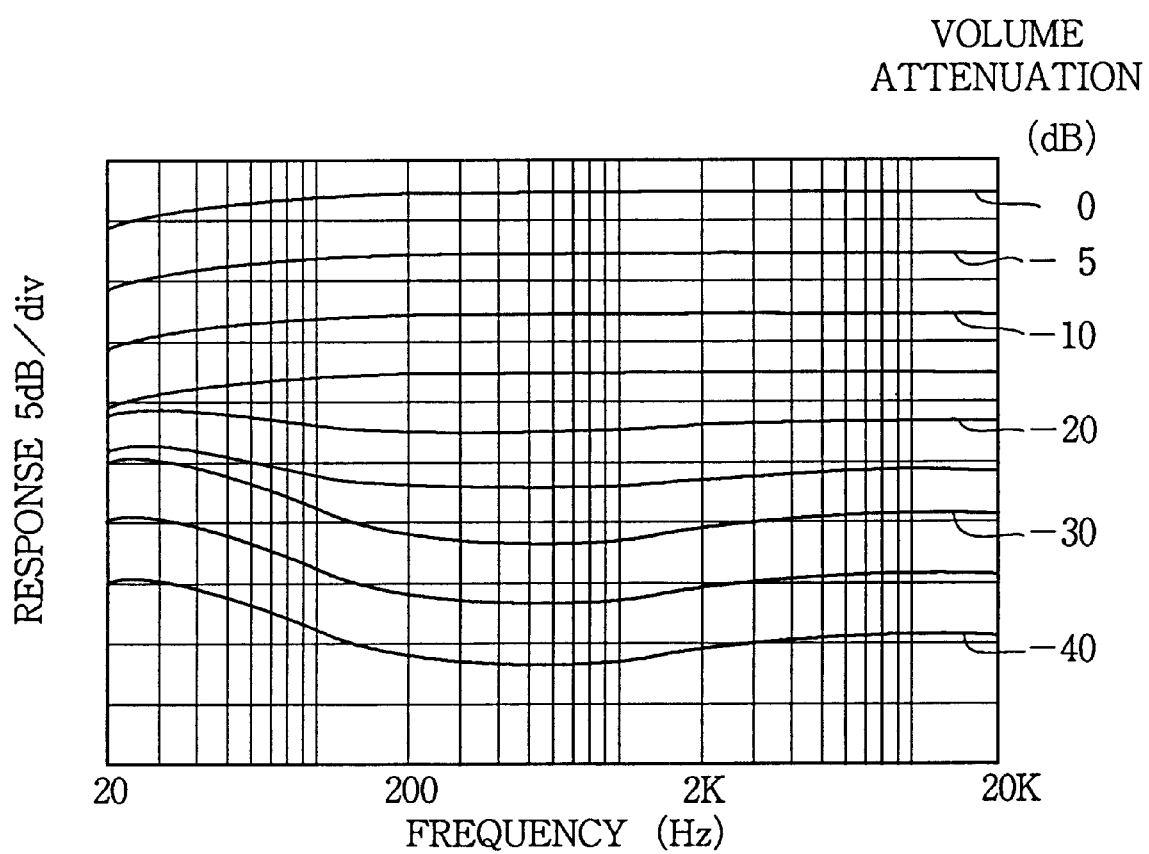
FIG. 10 is a diagram showing a frequency characteristic of the conventional system.

FIG. 2 shows a loudness volume control characteristic of the present invention. It will be seen that the frequency characteristic at a low level approaches the auditory sensation characteristic compared with the conventional characteristic of FIG. 10

The bass, mid-range and treble control circuits may be provided to produce only a necessary difference compensation for the increase and decrease. Furthermore, in case of a particular compensating amount, only the bass control circuit or both of the bass and mid-range control circuits may be provided. Alternatively, an individual control device is connected to the control terminal of each of the bass, mid-range and treble control circuits for controlling the voltage, thereby providing a tone control in addition to the loudness volume control.

Figure 3:
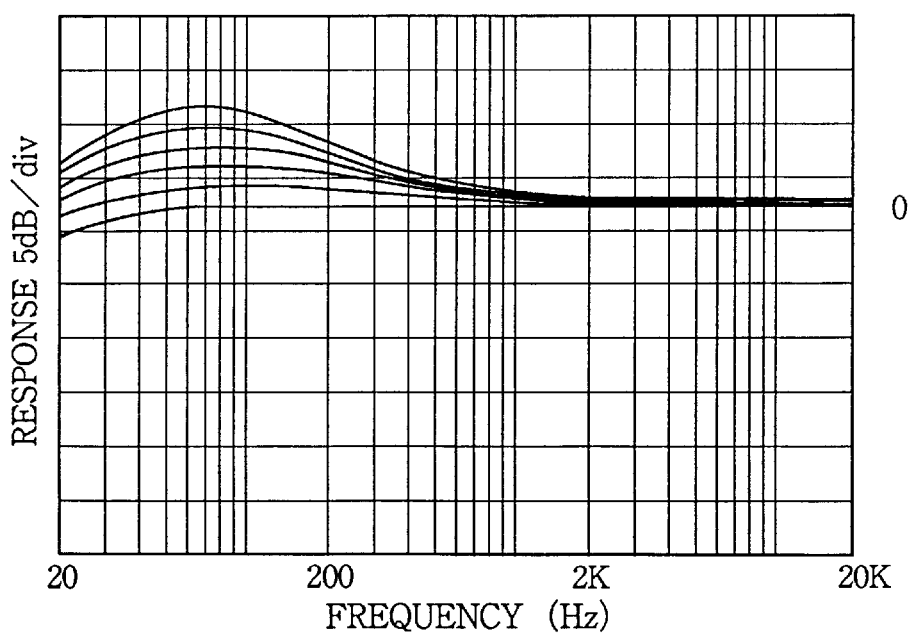
FIG. 3 is a diagram showing a frequency characteristic of a low frequency range controller of the system.
Figure 4:
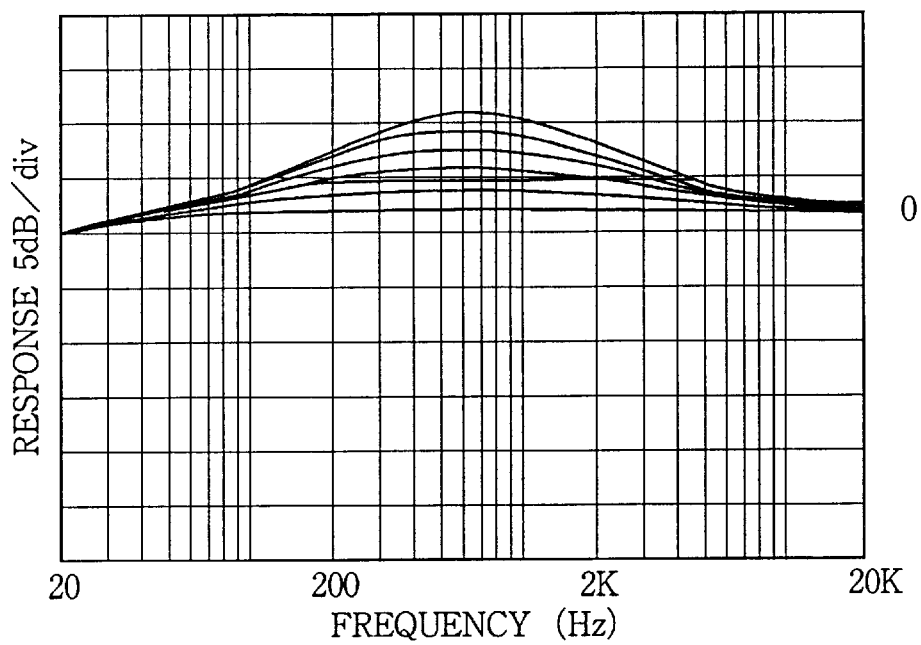
FIG. 4 is a diagram showing a frequency characteristic of a middle frequency range controller of the system.
Figure 5:
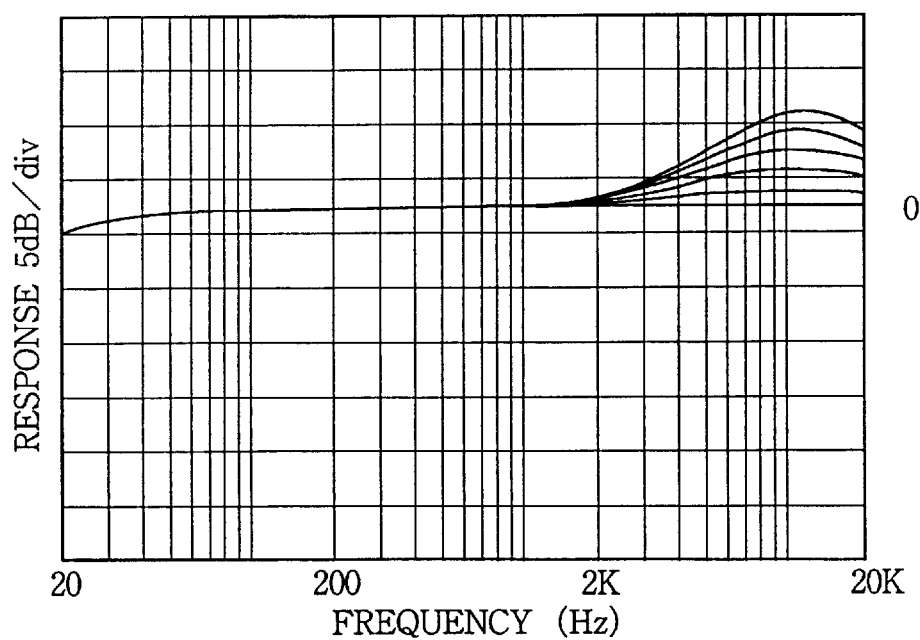
FIG. 5 is a diagram showing a frequency. characteristic of a high frequency range controller of the system.

FIGS. 3, 4 and 5 show frequency characteristics of the bass, mid-range and treble control circuits, respectively, as an example. In the example, characteristics for increasing the respective frequency ranges are shown. As another example, attenuating characteristics of the respective frequency ranges can be shown.

Figure 6:
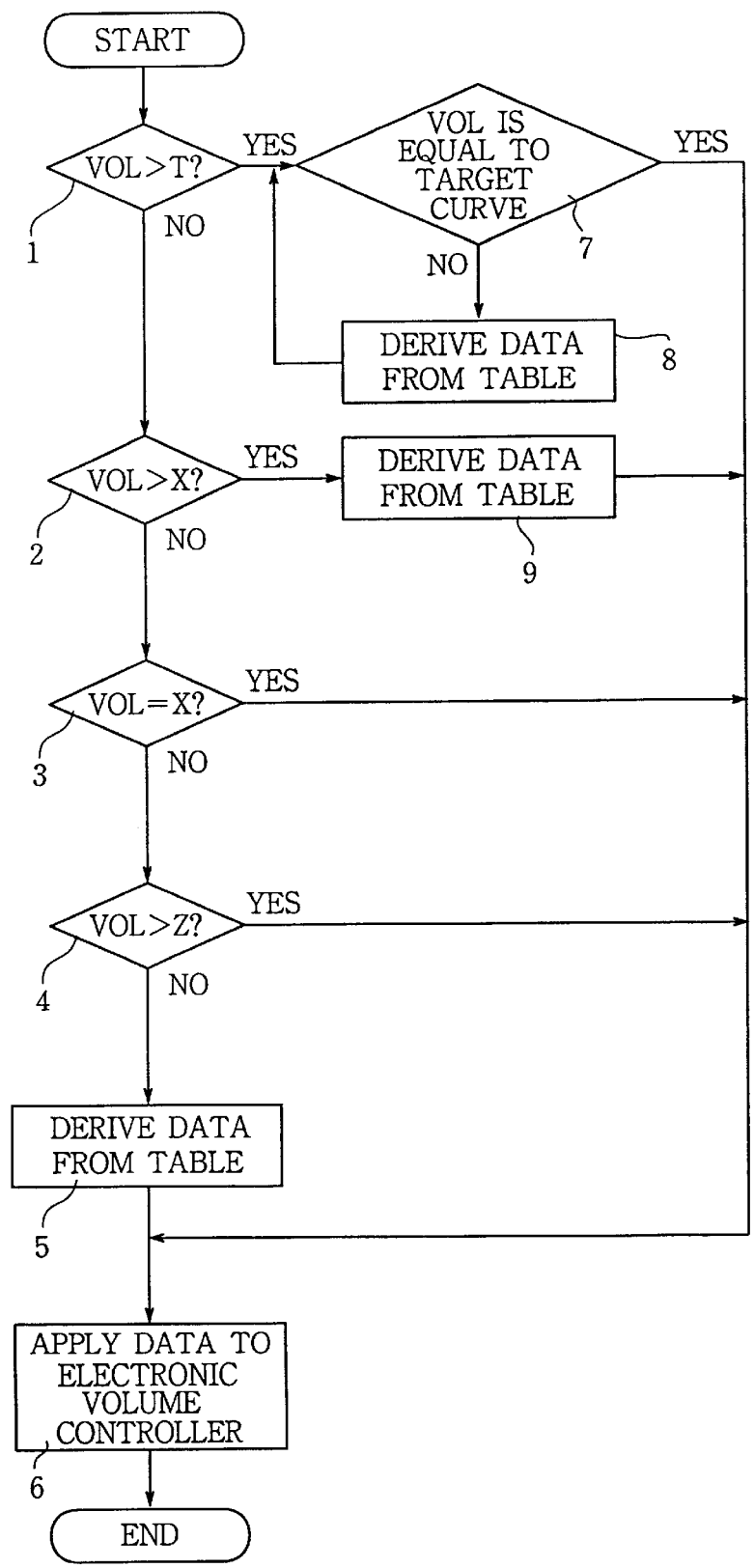
FIG. 6 is a flowchart showing an operation of the system.
Figure 8:
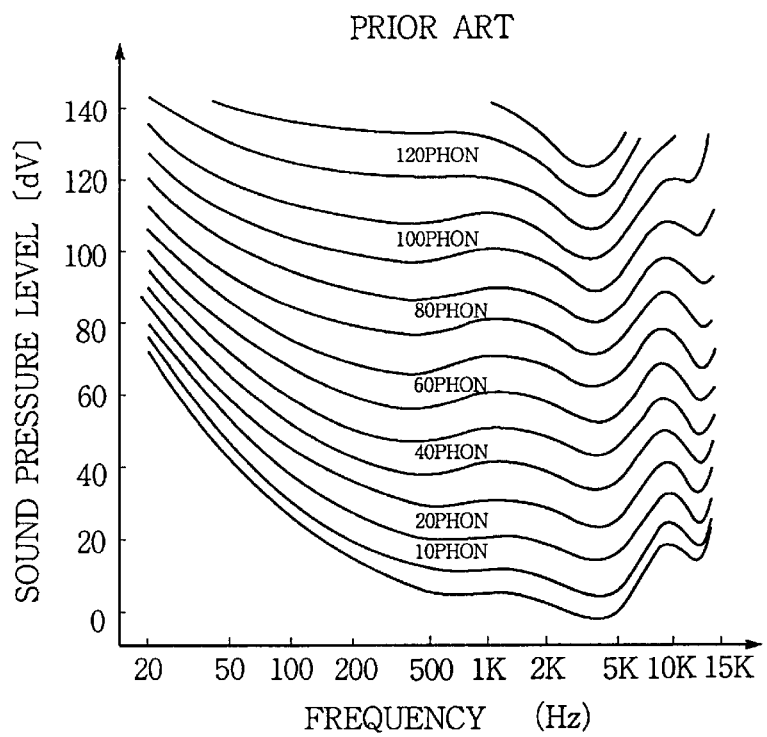
FIG. 8 is a diagram showing the equal loudness contour by Robinson et al.

FIG. 6 shows a flowchart of the operation of the system, using the table of FIG. 7. In the operation, a volume position signal VOL is an attenuation of the volume set in the electronic volume controller in accordance with the volume position signal. In the table of FIG. 7, the attenuation is represented by $-\infty$, $-60$, . . . $-30$, . . . in the column of "ATT(dB)".

Figure 9:
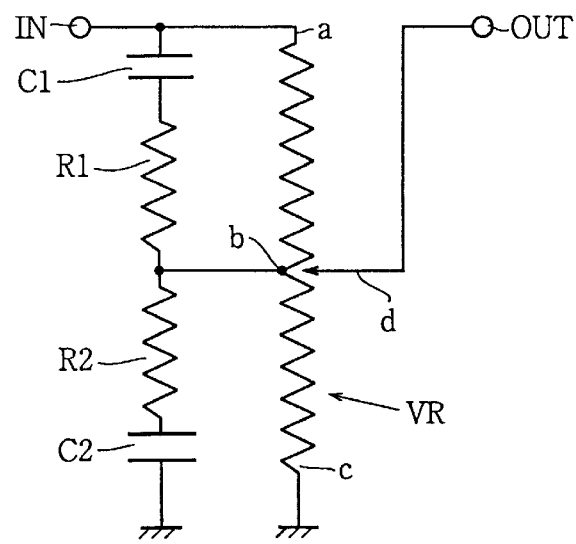
FIG. 9 is a circuit showing a conventional loudness volume control system.

Here, it is assumed that the volume position signal VOL at the position of the external volume control 121 (position of the slider d of FIG. 9) is −60 dB, a tap position level T at the tap position without the external CR network 111 is −30 dB, an actual attenuation at the tap position set by the external CR circuit 111 (see R1, R2, C1 and C2 of FIG. 9) is −40 dB which is a first volume level X, and a second volume level Z is −5 dB which is properly set. A frequency characteristic realized at the time is used between a first volume position X and a second volume position Z.

At a step 1, the volume position signal VOL is compared with the tap position level T at the tap position. If the VOL is not larger than the T, the program goes to a step 2. If VOL>T, the program goes to a step 7. Since the VOL is −60 dB which is smaller than the T of −30 dB, the program goes to the step 2.

At the step 2, the VOL is compared with the first volume level X. Since the VOL of −60 dB is not larger than the X of −40 dB, the program goes to a step 3. If VOL>X, the program goes to a step 9.

At the step 3, it is determined whether the VOL is equal to the X or not. Since the VOL of −60 dB is not equal to the X of −40 dB, the program goes to a step 4. If the VOL=X, the program goes to a step 6.

At the step S4, the VOL is compared with the second volume level Z. Since the VOL of −60 dB is not larger than the Z of −5 dB, the program goes to a step 5. If VOL>Z, the program goes to the step 6.

At the step 5, the VOL is controlled in accordance with data of the table of FIG. 7. Namely, in the VOL of −60 dB of the table of FIG. 7, data of the bass of +4 dB and the treble of +2 dB are derived from the table. It means that since the volume is small, the low frequency range is mostly increased.

At the step 6, the data is applied to the electronic volume controller 110, and the program is terminated.

On the other hand, when the volume position signal VOL is larger than the tap position level T at the step 1, the program goes to the step 7 where it is determined whether a curve of the VOL is equal to a target curve or not. If yes, the data is set to zero, and the program. goes to the step 6. If not, the program goes to a step 8 where a corresponding data is derived from the table of FIG. 7. The program returns to the step 7.

When VOL>X at the step 2, it means that the loudness compensation is excessively compensated. Thus, at the step 9, a corresponding data is derived from the table of FIG. 7 so that the compensating amount is properly corrected. The program goes to the step 6.

When VOL=X at the step 3, it means that the difference compensation is not needed, and the frequency characteristic realized in the tap position set in the external circuit is employed. The data is set to zero, and the program goes to the step 6.

When VOL>Z at the step 4, it means that a range is set for employing the frequency characteristic realized in the tap position set in the external circuit, and the program goes to the step 6.

In accordance with the present invention, the loudness volume control system having the tap is connected to the difference compensation device in series. It is possible to easily perform the compensation on the auditory sensation, and to obtain an acoustic characteristic of the auditory sensation with a simple structure.

In particular, in the volume position lower than the tap position, an improved characteristic is obtained without insufficiency of low and high frequency ranges. Since the conventional system is employed, the system is simplified in structure.

While the invention has been described in conjunction with preferred specific embodiment thereof, it will be understood that this description is intended to illustrate and not limit the scope of the invention, which is defined by the following claims.

What is claimed is:

1. A loudness volume control system comprising:
an external volume controller having volume positions of a tap;
an electronic volume controller with a tap that corresponds to one of the volume positions, wherein the electronic volume controller is configured to receive an input audio signal, and to generate an output audio signal by varying a level of the input audio signal and by giving a frequency characteristic to the input audio signal;
a MPU connected with the external volume controller and for controlling the electronic volume controller by detecting a selected volume position of the external volume controller for the electronic volume controller;
at least one difference compensation circuit being arranged so as to receive the output audio signal and to further adjust the frequency characteristic, wherein an adjustment of the frequency characteristic is based on the selected volume position of the external volume controller for the electronic volume controller; and
memory means connected with the MPU and storing control quantities for controlling the at least one difference compensation circuit;
wherein the MPU designates a corresponding control quantity in the memory based on the selected volume position and referring to the control quantities; and
wherein the frequency characteristic given to the input signal by the electronic volume controller is fixed where the selected volume position is smaller than a volume position corresponding to the tap, and both high and low frequency ranges of the input signal are relatively increased to a mid frequency range by the electronic volume controller.

2. The system according to claim 1, wherein when the selected volume position is changed, the difference compensation circuit synchronously changes the control quantity.

3. The system according to claim 1, wherein the at least one difference compensation circuit is independently operable as a tone control by a control device.

4. A loudness volume control system comprising:
a volume controller having a tap for controlling volume in a whole audio frequency band to a volume level;
memory means storing control quantities for controlling an output level in a part of the audio frequency band in accordance with the volume level;
at least one difference compensation circuit connected to the volume controller in series, which is provided to be controlled in accordance with the volume level;
the difference compensation circuit being arranged so as to control the output level in a part of the audio frequency band in accordance with the volume level by the volume controller and the control quantity stored in the memory means, wherein the difference compensation circuit is arranged so as to attenuate a bass range level or a treble range level, or to increase a mid-range level in a first level range from a maximum volume level to a volume level of the volume controller, thereby providing a frequency characteristic having a small level changing quantity, and so as to attenuate the mid-range level, or to increase the bass range level or the treble range level in a second level range lower than the volume level.

5. A loudness volume control system comprising:
a volume controller having a tap for controlling volume in a whole audio frequency band to a volume level;
memory means storing control quantities for controlling an output level in a part of the audio frequency band in accordance with the volume level;
at least one difference compensation circuit connected to the volume controller in series, which is provided to be controlled in accordance with the volume level;
the difference compensation circuit being arranged so as to control the output level in a part of the audio frequency band in accordance with the volume level by the volume controller and the control quantity stored in the memory means, wherein the difference compensation circuit is provided to attenuate only the bass range.

6. A loudness volume control system comprising:
a volume controller having a tap for controlling volume in a whole audio frequency band to a volume level;

memory means storing control quantities for controlling an output level in a part of the audio frequency band in accordance with the volume level;

at least one difference compensation circuit connected to the volume controller in series, which is provided to be controlled in accordance with the volume level;

the difference compensation circuit being arranged so as to control the output level in a part of the audio frequency band in accordance with the volume level by the volume controller and the control quantity stored in the memory means. wherein the difference compensation circuit is provided to attenuate only the treble range.

7. A loudness volume control system comprising:

a volume controller having a tap for controlling volume in a whole audio frequency band to a volume level;

memory means storing control quantities for controlling an output level in a part of the audio frequency band in accordance with the volume level;

at least one difference compensation circuit connected to the volume controller in series. which is provided to be controlled in accordance with the volume level;

the difference compensation circuit being arranged so as to control the output level in a part of the audio frequency band in accordance with the volume level by the volume controller and the control quantity stored in the memory means. wherein the difference compensation circuit is provided to attenuate the bass range and the treble range.

8. A loudness volume control system comprising:

a volume controller having a tap for controlling volume in a whole audio frequency band to a volume level;

memory means storing control quantities for controlling an output level in a part of the audio frequency band in accordance with the volume level;

at least one difference compensation circuit connected to the volume controller in series. which is provided to be controlled in accordance with the volume level;

the difference compensation circuit being arranged so as to control the output level in a part of the audio frequency band in accordance with the volume level by the volume controller and the control quantity stored in the memory means, wherein the difference compensation circuit is provided to increase the mid-range.

9. A loudness volume control system comprising:

a volume controller having a tap for controlling volume in a whole audio frequency band to a volume level;

memory means storing control quantities for controlling an output level in a part of the audio frequency band in accordance with the volume level;

at least one difference compensation circuit connected to the volume controller in series, which is provided to be controlled in accordance with the volume level;

the difference compensation circuit being arranged so as to control the output level in a part of the audio frequency band in accordance with the volume level by the volume controller and the control quantity stored in the memory means, wherein the difference compensation circuit comprises a voltage control amplifier and an external CR network.

* * * * *